(12) United States Patent
Schmidt et al.

(10) Patent No.: US 6,963,096 B2
(45) Date of Patent: Nov. 8, 2005

(54) SEMICONDUCTOR ELEMENT HAVING A SEMI-MAGNETIC CONTACT

(75) Inventors: Georg Schmidt, Lindflur (DE); Laurens Molenkamp, Würzburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/667,730

(22) Filed: Sep. 22, 2003

(65) Prior Publication Data

US 2004/0113188 A1 Jun. 17, 2004

Related U.S. Application Data

(63) Continuation of application No. PCT/DE02/00989, filed on Mar. 19, 2002.

(30) Foreign Application Priority Data

Mar. 20, 2001 (DE) .......................................... 101 13 495
Mar. 27, 2001 (DE) .......................................... 101 14 963

(51) Int. Cl.$^7$ ............................................. H01L 29/76
(52) U.S. Cl. ...................... 257/295; 257/298; 257/303; 257/306; 257/324; 438/3; 438/240
(58) Field of Search ............................ 257/295, 421–427

(56) References Cited

U.S. PATENT DOCUMENTS

| | | | | | |
|---|---|---|---|---|---|
| 5,565,695 | A | * | 10/1996 | Johnson ........................ | 257/295 |
| 5,640,343 | A | * | 6/1997 | Gallagher et al. ............ | 365/171 |
| 5,654,566 | A | * | 8/1997 | Johnson ........................ | 257/295 |
| 5,962,905 | A | * | 10/1999 | Kamiguchi et al. .......... | 257/421 |
| 6,163,437 | A | * | 12/2000 | Inage et al. ................... | 360/128 |
| 6,624,490 | B2 | * | 9/2003 | Flatte et al. ................... | 257/421 |

FOREIGN PATENT DOCUMENTS

| WO | 00/59051 | * | 10/2000 |
|---|---|---|---|
| WO | 00/59052 | * | 10/2000 |

OTHER PUBLICATIONS

Fiederling, R. et al.:"Injection and Detection of a Spin–Polarized Current in a Light–Emitting Diode", Nature, vol. 402, Dec. 16, 1999, pp. 787–790.*

Schmidt, G. et al.: "Spin Injection Into Semiconductors, Physics and Experiments", Institute of Physics Publishing, Semicond. Sci. Technol., IOP Publishing Ltd, vol. 17, Apr. 2002, pp. 310–321.

Daughton, J. M. et al.: "Applications of Spin Dependent Transport Materials", J. Phys. D: Appl. Phys., IOP Publishing Ltd, vol. 32, Nov. 21, 1999, pp. R169–R177.

Datta, S. et al.: "Electronic Analog of the Electro–Optic Modulator", Applied Physics Letters, vol. 56, No. 7, Feb. 12, 1990, pp. 665–667.

Oestreich, M. et al.: "Spin Injection Into Semiconductors", Applied Physics Letters, American Institute of Physics, vol. 74, No. 9, Mar. 1, 1999, pp. 1251–1253.

Fiederling, R. et al.: "Injection and Detection of a Spin–Polarized Current in a Light–Emitting Diode", Nature, www.nature.com, vol. 402, Dec. 16, 1999, pp. 787–790.

Oestreich, M.: "Injecting Spin Into Electronics", Nature, www.nature.com, Macmillan Magazines Ltd, vol. 402, Dec. 16, 1999, pp. 735–737.

* cited by examiner

Primary Examiner—Andy Huynh
(74) Attorney, Agent, or Firm—Laurence A. Greenberg; Werner H. Stemer; Ralph E. Locher

(57) ABSTRACT

The invention relates to a magnetoresistive semiconductor element, including a first contact and a second contact, and also a layer of a nonmagnetic semiconductor arranged between the first contact and the second contact. The first contact is composed of a semi-magnetic material. The semi-magnetic material is a strongly paramagnetic material whose electron spins have no preferential direction without an action of an external magnetic field. Under the action of an external magnetic field, the electrons are spin-polarized in the first contact. When a voltage is applied this results in the injection of spin-polarized electrons into the nonmagnetic semiconductor. As a result, in the nonmagnetic semiconductor, only one of the spin channels can be used for transporting the charge carriers, so that a positive magnetoresistive effect is obtained.

17 Claims, 13 Drawing Sheets

SEMICONDUCTOR ELEMENT HAVING A SEMI-MAGNETIC CONTACT

CROSS-REFERENCE TO RELATED APPLICATION

This application is a continuation of copending International Application No. PCT/DE02/00989, filed Mar. 19, 2002, which designated the United States and was not published in English.

BACKGROUND OF THE INVENTION

Field of the Invention

The invention relates to a magnetoresistive semiconductor element that can be used, in particular, in read heads for reading out information stored in magnetic storage media. The invention also relates to a storage element, a field-effect transistor, a bipolar transistor, and a magnetic sensor, which include the magnetoresistive semiconductor element.

Magnetoelectronics and the spin-polarized transport of charge carriers have experienced rapid development in the last decade. This development was triggered primarily by the discovery of the so-called giant magnetoresistance (GMR) and tunneling magnetoresistance (TMR). These two effects made it possible for the first time to convert a magnetic field, or an item of magnetization information, directly into a change in resistance. Both effects are based on the transport of spin-polarized electrons between two ferromagnetic contacts. The relative magnetization of the two contacts is crucial for the resistance of the overall component. In this case, GMR is utilized in purely metallic structures and TMR is utilized in structures with an oxide-type tunneling barrier between two ferromagnetic metal layers. At present, TMR structures are used for electronically readable magnetic memories MRAMS (magnetic random access memories), while GMR is commercially utilized primarily in magnetic field sensor technology and in hard disk read heads.

In the case of GMR, in a purely metallic component with two ferromagnetic contacts between which a layer of a nonmagnetic metallic conductor is arranged, the change in resistance between the parallel and the antiparallel magnetization is measured. With the application of an external field and hence a parallel orientation of the magnetizations in adjacent ferromagnetic layers, the resistance of the component decreases. On account of the metallic conductivity, the impedance of such an element is difficult to match to semiconductor circuits, which makes it more difficult to integrate GMR structures into such circuits.

In 1999, R. Fiederling, M. Keim, G. Reuscher, W. Ossau, G. Schmidt, A. Waag and L. W. Molenkamp (Nature 402, 787–790 (1999)) were able to demonstrate the injection of spin-polarized electrons into a nonmagnetic semiconductor by measuring the circular polarization of the light generated by a light-emitting diode. The polarization of the electron spins was achieved by injecting the electrons into a GaAs semiconductor via a $Be_{0.07}Mn_{0.03}Zn_{0.9}Se$ semiconductor contact. Circularly polarized light was generated by recombination with unpolarized holes injected from the opposite side of the layer of the GaAs semiconductor.

SUMMARY OF THE INVENTION

It is accordingly an object of the invention to provide magnetoresistive semiconductor element, a field effect transistor, a bipolar transistor, a magnetic sensor, a method of measuring the intensity of a magnetic field, which overcome the above-mentioned disadvantages of the prior art apparatus and methods of this general type.

In particular, it is an object of the invention to provide a magnetoresistive semiconductor element which makes it possible to detect even very weak magnetic fields, exhibits a distinct change in the resistance under the action of an external magnetic field (increase of $\Delta R/R$), and has a high sensitivity S ($S=\Delta R/R/\Delta H$).

With the foregoing and other objects in view there is provided, in accordance with the invention, a magnetoresistive semiconductor element including: a first contact made of a semi-magnetic material; a second contact; and a layer of a nonmagnetic semiconductor configured between the first contact and the second contact. Additionally, a tunnel barrier is configured between the first contact and the layer of the nonmagnetic semiconductor.

In the semiconductor element, the charge transport from the first contact to the second contact is effected either only by electrons or only by holes. The charge carriers thus enter into the nonmagnetic semiconductor through the first semi-magnetic contact and are extracted from the nonmagnetic semiconductor again at the second contact. The inventive semiconductor element thus already differs from the LED described above by the fact that, in the case of the latter, spin-polarized electrons from a first contact are injected into the nonmagnetic semiconductor, but they recombine, with the emission of light, in the nonmagnetic semiconductor with unpolarized holes injected from the second contact into the nonmagnetic semiconductor. The charge transport in the diode is thus effected both by electrons and by holes. In contrast to the diode described above, in the inventive semiconductor element, the charge transport in the semiconductor takes place only by electrons or only by holes. The two semiconductor elements are thus based on different charge transport. Furthermore, the semiconductor element preferably has an approximately linear I/V characteristic curve.

A current flows through the inventive component for the purpose of resistance measurement. The component can be combined with further semiconductor elements, in which case the current, as long as it does not leave the semiconductor, is carried by only one kind of charge carrier. These charge carriers are preferably electrons. Other currents which flow in the case of integration in the semiconductor, but which do not serve for resistance measurement, can also be carried by the respective other kind of charge carrier. In this case p-n junctions are contained in their current path. In this case, what is embodied as a semiconductor is the section of the path of a current used for resistance measurement from a first metallic or metal-like contact, at which the current enters into the semiconductor, as far as a further metallic or metal-like contact, at which the current leaves the semiconductor again. Metal-like contacts are considered to be contacts having conduction properties comparable to metallic contacts. Such contacts include, for example, silicides or polysilicon with a suitably high doping. In the embodiment described, the magnetoresistive semiconductor element is thus integrated into the section formed by the semiconductor.

A p-n diode has a strongly nonlinear current-voltage characteristic. A small change in voltage can therefore greatly alter the differential resistance $\Delta V/\Delta I$. For this reason, a p-n diode is preferably avoided in an electric circuit that serves for measuring a resistance.

In the diode described by Fiederling et al., a magnetoresistive effect, as is observed for the semiconductor element according to the invention, would also not be expected since the resistance of such an LED is very high and practically no alteration of the resistance occurs as a result of an external magnetic field.

In contrast to the GMR effect, the resistance of the semiconductor element increases under the action of an external magnetic field. Thus, a positive magnetoresistance is measured which may amount to as much as 100% given complete polarization of the conduction electrons. What is measured in this case is the alteration of the resistance between the magnetization 0, i.e. without the action of an external magnetic field, and same-sense magnetization of the spins of the contact made of the semi-magnetic material under the action of an external field.

As semiconductor elements, the integration of the semiconductor element according to the invention into microelectronic integrated circuit configurations is possible without difficulty. Furthermore, the semiconductor elements according to the invention can also be combined without difficulty with other electronic elements, so that it is possible to produce new kinds of storage elements, such as MRAMS, or sensors for magnetic fields. Since, without the action of an external magnetic field, the conduction electrons are unpolarized and there is no occurrence of angular dependence of the polarization of the conduction electrons in the external magnetic field, the initial state is always well-defined. Furthermore, there is no need for coupling the magnetizations of first and second contacts as in GMR structures, for which reason the semiconductor elements according to the invention are available for significantly wider application by appropriate modification of the second contact.

What is important for a magnetoresistive semiconductor element is the ratio of the change in resistance under the action of an external field to the total resistance of the element $\Delta R/R$. It holds true for the semiconductor element according to the invention that the total resistance of the component must not be significantly greater than the change in resistance.

A semi-magnetic material is understood to be a material having strong paramagnetism. In contrast, the spins are coupled in ferromagnetic materials. That is to say the conduction electrons generally already have a polarization without the action of an external field. A semi-magnetic magnetic material has unpolarized conduction electrons without the action of an external magnetic field. The spins of the electrons thus have no preferential orientation. When an external magnetic field is applied, the conduction electrons of the material are spin-polarized. The spin polarization may be brought about e.g. by a large degree of Zeeman splitting of the electronic levels. As a result of the high degree of splitting, the injected electrons (or charge carriers) occupy the energetically more favorable lower Zeeman level. These spin-polarized electrons can subsequently be injected into the nonmagnetic semiconductor.

Materials having a large g factor can be used as semi-magnetic materials. The g factor describes the effective Lande factor of an electron. A large g factor leads to a high degree of Zeeman splitting of the states. In order to be able to observe a distinct change in the resistance of the electrical component, the g factor should preferably be greater than 50, particularly preferably greater than 200. By way of example thinned magnetic II/VI semiconductors are suitable. ZnMnSe-based semiconductors are particularly suitable. The spins of the manganese in undoped or n-doped ZnMnSe-(II/VI-semiconductors) are normally antiferromagnetically coupled. At very low Mn concentrations and at low temperatures, the sp-d exchange interaction leads to a very large g factor of up to 100, which leads to a very large degree of Zeeman splitting of the states for the conduction electrons. The magnetic Mn ions can be incorporated isoelectronically into the semiconductor, so that the conductivity and also the type of charge carriers (electrons or holes) can be controlled by the incorporation of further dopings. By way of example, a doping with iodine or chlorine is suitable for an n-type doping.

Furthermore, it is also possible to use III/V semiconductors, such as e.g. GaMnAs in non-ferromagnetic phase or InSb. In this case, the doping of the semiconductor can be suitably effected using Be, Si, C, Zn, Te or S. Furthermore, it is also possible to use narrowband semiconductors such as HgCdTe. A doping with iodine or chlorine may be effected here, if necessary. The dopings specified should be understood as only being examples. The person skilled in the art knows—from semiconductor technology— diverse dopants that can be used to respectively achieve an n-type or p-type doping.

In principle, all nonmagnetic semiconductors, e.g. group IV, III/V and II/VI semiconductors, can be used for the layer of the nonmagnetic semiconductor. Silicon and Si/SiGe two-dimensional electron gases are particularly suitable since these have a low degree of spin scattering and only minor difficulties occur in the miniaturization of the semiconductor element according to the invention. By way of example, Si, P, As, Sb, B can be used as dopings. These dopings should also be understood as only being examples. It is inherently possible to use all substances known for the doping of semiconductors.

The change in the resistance of the semiconductor element in an external magnetic field can be observed in particular if the first contact and the nonmagnetic semiconductor have a comparable electrical conductivity. The resistivities $\rho$ of the semi-magnetic material and of the nonmagnetic semiconductor preferably lie in a range of $10^{-3}$–100 $\Omega$cm, preferably 0.01–10 $\Omega$cm, particularly preferably 0.1–1 $\Omega$cm. The ratio of the resistivities of semi-magnetic contact and nonmagnetic semiconductor $\rho_{semimagn.}/\rho_{nonmagn.}$ preferably lies in a range of 1000–0.01, preferably 100–0.1. The semi-magnetic contact preferably has a conductivity which is the same as or less than that of the nonmagnetic semiconductor. The conductivity of the first contact and the nonmagnetic semiconductor can be coordinated with one another by appropriate doping. The ratio of the resistivities of the semi-magnetic material of the first contact and of the nonmagnetic semiconductor is essentially important when no ideal spin polarization (~100%) can be achieved in the semi-magnetic first contact. Given ideal spin polarization, only spin-polarized charge carriers are injected into the nonmagnetic semiconductor. The conductivity of the nonmagnetic semiconductor is then of secondary importance.

The observed change in resistance can be clearly illustrated using the two spin channel model. Two channels are available for the charge transport in the nonmagnetic semiconductor. Charge carriers having a parallel orientation of the spin with respect to the external field are transported in one channel and charge carriers having an antiparallel orientation of the spin with respect to the external field are transported in the other channel. The charge carriers are transported in equal proportions in the two channels. An external magnetic field therefore has no influence on the resistance of the nonmagnetic semiconductor. If the injection into the nonmagnetic semiconductor is then effected via a semi-magnetic contact, without the action of an external field, the charge transport through the nonmagnetic semiconductor is likewise effected in equal portions in the two spin channels. If the semiconductor element is introduced into an external magnetic field, the Zeeman terms are split in a manner dependent on the magnetic field strength. The conduction electrons then preferably occupy the energetically more favourable levels with a parallel orientation of the spin with respect to the external magnetic field. If the degree of energetic splitting is large enough, the conduction electrons are all oriented parallel to one another and to the external field. The orientation of the electron spins is preserved in the event of transition from the semi-magnetic contact into the nonmagnetic semiconductor. This causes a suppression of a spin channel of the conductivity in the nonmagnetic semiconductor. Whereas without spin injection, the current in the nonmagnetic semiconductor is carried in equal portions by both spin orientations (parallel and antiparallel or spin up and spin down), electrons of one spin orientation now have to carry the entire current. Since their number does not appreciably increase, however, the resistance rises. A positive magnetoresistance is obtained. A rise in the resistance in the nonmagnetic semiconductor by 100% can be achieved in the ideal state given complete spin polarization of the conduction electrons.

The observed change in resistance is based on a mechanism which differs fundamentally from the mechanism of the change in resistance in GMR and TMR structures. Whereas the change in resistance is determined by the spin polarization of the second ferromagnetic contact in the case of the GMR effect and TMR effect, the change in resistance is caused by a reduction of the occupation of a spin channel in the nonmagnetic semiconductor in the case of the component according to the invention. It goes without saying, however, that the charge transport explained above only represents one model presentation for elucidating the observed change in resistance and other models can also be used for elucidation purposes. The model should not, therefore, be regarded as limiting for the invention. Ultimately, the observed changes in resistance are based on quantum effects which can be described only to a very limited extent by clear models.

In principle, the semiconductor element according to the invention can also be employed for transporting holes. In this case, however, the spins are rapidly depolarized as a result of the strong interactions, so that the observed effects are not as pronounced as in the case of charge transport by electrons.

If the change in resistance of the semiconductor element according to the invention is at least of the order of magnitude of the total resistance of the component, then the magnetoresistive semiconductor element can replace GMR or TMR structures in specific applications. Whereas two ferromagnetic contacts are necessary in each case for GMR and TMR, the magnetoresistive semiconductor element according to the invention merely requires one contact made of a semi-magnetic material whose spins are not polarized without the action of an external magnetic field. The material of the second contact is initially not subject to any particular limitations. All that is necessary is that the charge carriers can flow away from the nonmagnetic semiconductor again via the second contact.

The degree of spin polarization is not only determined by the magnitude of the external magnetic field, but also increases with increasing extent of the contact made of the semi-magnetic material in the direction of the charge flow. The spin polarization of the electrons, that is to say the transition thereof into the lower Zeeman level, is effected by spin scattering. In order to achieve an efficient spin polarization, the thickness of the layer of the semi-magnetic material should therefore be a multiple of the spin scattering length. The spin scattering length is dependent on the material used. Mn-containing semiconductors have a high degree of spin scattering which generates a spin flip length of a few nanometers. In the case of semiconductors such as InSb, which have a lower degree of spin scattering, the spin flip length is significantly greater, for which reason significantly greater layer thicknesses are also necessary. In the case of layer thicknesses of the semi-magnetic contact in the region of 3 nm, it is generally possible to observe approximately no spin polarization and hence virtually no change in the resistance of the inventive semiconductor element in the external magnetic field. Depending on the material used, suitable layer thicknesses of the first contact preferably lie in the range from 10 to 1000 nm, and even more preferably from 50 to 300 nm.

The construction of the magnetoresistive semiconductor element according to the invention can be varied within wide limits, which paves the way for a multiplicity of applications.

According to a preferred embodiment, a tunneling barrier is arranged between the first contact made of the semi-magnetic material and the layer of the nonmagnetic semiconductor. The layer thickness of the tunneling barrier generally lies in a range from 3 to 7 nm. The tunneling barrier may either include semiconductors, such as AlAs or GaAs, or be oxidic, such as e.g. aluminum oxide, magnesium oxide, titanium oxide, or silicon oxide. Layers made of silicon nitride are also suitable, by way of example. In this case, it is possible to use the customary materials as are known for example for semiconductor tunneling barriers from resonant tunnel diodes. The efficiency of the spin injection into the nonmagnetic semiconductor can be increased by the tunneling barrier. Given the same spin polarization in the semi-magnetic contact, the spin polarization in the nonmagnetic semiconductor can be increased when a tunneling barrier is used.

As has already been explained further above, for a change in resistance under the action of an external magnetic field, it already suffices for the first contact to be composed of a semi-magnetic material. It is necessarily the case that only the extraction of the charge carriers from the nonmagnetic semiconductor is effected via the second contact. Therefore, the second contact is not inherently subject to any particular limitations. However, through a suitable choice of material for the second contact, it is possible to develop components for specific applications or it is possible to modify the observed change in resistance in the external magnetic field.

According to one embodiment, the second contact is composed of a nonmagnetic material. All nonmagnetic semiconductors as well as metals can be used. Examples of suitable metals are Al, Cr, Ti, Pt, Ni, Au/Ge alloys. The contacts are preferably made of materials, which have a linear I/V characteristic curve, and which generate a low contact resistance. The change in resistance in the external magnetic field is then caused only by the polarization of the charge carriers, in particular electrons, injected into the semiconductor.

However, the second contact is preferably likewise composed of a semi-magnetic material. In this case, the second contact may be constructed from the same materials as the first contact, but it is also possible to use different semi-magnetic materials. The charge transport in the semiconductor element according to the invention takes place in the diffusive region owing to the small dimensions of the semiconductor element. Therefore, the spin polarization is not dependent on the current direction. Although the electrons move, on average, in a specific direction, a statistical movement is superposed on this movement. The electrons thus move in all possible directions and are scattered in the process. Therefore, if a semi-magnetic contact is likewise used as second contact, this is equivalent to two cascaded elements which are constructed from a first contact made of a semi-magnetic material, a nonmagnetic semiconductor, and a second contact made of a nonmagnetic material. That is to say it corresponds to the embodiment described above. In this case, the total resistance R would be composed of 2×R (semi-magnetic contact)+2×R (nonmagnetic semiconductor)+2×R (nonmagnetic contact). In the case where the second contact is embodied as semi-magnetic contact, the total resistance R decreases to 2×R (semi-magnetic contact)+2×R (nonmagnetic semiconductor), while the achievable change in resistance ΔR in the external magnetic field remains the same. As a result, ΔR/R increases, i.e. the sensitivity of the semiconductor element rises.

According to a preferred embodiment, a tunneling barrier may likewise be arranged between the nonmagnetic semiconductor and the second semi-magnetic contact. In this case, the tunneling barrier may be produced from the same materials as described above.

According to a specific embodiment of the magnetoresistive semiconductor element, the second contact is composed of a ferromagnetic material. A semiconductor element with a positive magnetoresistance is likewise obtained in this case. However, the characteristic curve is asymmetrical until reaching the coercive field strength of the ferromagnet. The ferromagnetic contact likewise injects spin-polarized electrons. However, until exceeding the coercive field, the electrons always have only one preferential direction which is independent of the orientation of the external magnetic field. If the first and second contacts have a spacing which is smaller than the spin flip length, then the ferromagnetic contact influences the spin injection from the semi-magnetic contact. It is thereby possible to produce a polarity-sensitive magnetic field sensor by interconnecting, for example, two semiconductor elements whose polarization of the ferromagnetic contact is rotated by 180° relative to one another. There are many conceivable applications in which not only the magnitude, but also the direction of a magnetic field is to be measured. One possible application of such a semiconductor element is, for example, in a sensor which is to be used to measure the angle of lock of the controller of a motor vehicle.

It is also the case with an embodiment of the second contact made of a ferromagnetic material that tunneling barriers may in each case be arranged between the first contact and the nonmagnetic semiconductor, and between the nonmagnetic semiconductor and the ferromagnetic second contact.

The magnetoresistive semiconductor element according to the invention can be used for a multiplicity of applications. An application for information storage or for logic circuits is possible, by way of example. The semiconductor element according to the invention can equally be used e.g. in sensors:

Therefore, the invention also relates to a storage element including the magnetoresistive semiconductor element described above, and also a ferromagnetic element arranged adjacent to this element. In this case, the configuration is chosen such that the semi-magnetic contact is situated in the leakage field of the ferromagnetic element. Upon rotation of the magnetization of the ferromagnetic element by 90°, the resistance of the magnetoresistive semiconductor element decreases since the semi-magnetic contact is then no longer situated in the leakage field of the ferromagnetic element. The two states with high and low resistance can then be assigned to the states 0 and 1, for example. In contrast to the known MRAMs, the magnetization only has to be rotated, which can be achieved more simply than a fold-over of the magnetization by 180°. The electrical part is constructed only from semiconductor materials and can therefore be integrated into microelectronic circuits in a simple manner. With a configuration in a matrix, the element can be decoupled from other elements e.g. by Schottky diodes.

The magnetoresistive semiconductor element according to the invention can also be configured as a field-effect transistor. The field-effect transistor includes a source electrode, a drain electrode and a gate electrode. At least one first contact made of a semi-magnetic material is provided, by which spin-polarized charge carriers are injected into the source electrode and/or the drain electrode, or extracted therefrom. A component of increased complexity is thus available for the same structural size. Thus, by way of example, the memory element described above can be integrated directly into a field-effect transistor. In this case, the charge transport from the source to the drain is effected only by one kind of charge carriers. Under the influence of the field generated by the gate electrode, a conduction channel arises in the semiconductor between the source and the drain. In this channel, the charge transport is effected by electrons.

The semiconductor element according to the invention can also be integrated into a bipolar transistor. The bipolar transistor includes a section acting as an emitter, a section acting as a collector and a section acting as a base. The section acting as a base is arranged between sections acting as the emitter and collector. At least one first contact is provided, by which spin-polarized charge carriers are injected into the emitter and/or extracted from the collector.

The bipolar transistor is preferably configured as an npn transistor. The spin polarization of the charge carriers, preferably electrons, is effected in the first contact, which is preferably constructed from a semi-magnetic material. The current from the emitter to the collector, which current is used for the observation of the magnetoresistive effect, is brought about only by one kind of charge carriers, preferably electrons.

Moreover, the magnetoresistive semiconductor element can be used as a sensor for magnetic fields. In this case, preference is attached to an embodiment as a read head for the read-out of information stored in magnetic storage media. Such a magnetic storage medium may be e.g. a hard disk. In this case, such a sensor includes the magnetoresistive semiconductive element described above, an electrical supply and outgoing leads to the first and from the second contact and also a measuring device for measuring the change in resistance, which is connected to the supply and outgoing lead.

Under the action of an external magnetic field, the semiconductor element according to the invention exhibits a change in its resistance and can therefore be used, as described, as a sensor for detecting magnetic fields. Therefore, the invention also relates to a method for measuring the strength of a magnetic field. The magnetic field acts on a sensor in which charge carriers are spin-polarized in a first contact. The spin-polarized charge carriers are injected into a nonmagnetic semiconductor. The charge carriers are extracted from the non-magnetic semiconductor and into a second contact and the change in the resistance relative to an initial state is measured.

The initial state is formed in a suitable manner by a resistance of the sensor without the action of a magnetic field.

In order to be able to measure a change in the resistance, the charge transport within the semiconductor is permitted to be effected only by one kind of charge carrier. That is to say either only by electrons or only by holes. If a change of charge carriers takes place in the charge transport within the nonmagnetic semiconductor, this leads to a large voltage drop and thus to a great rise in the resistance, for which reason a change in the resistance can no longer be observed. Such a change of charge carriers takes place, for example, at the p-n junction of a diode. A configuration with a diode cannot, therefore, be used for the method according to the invention.

Owing to the short spin lifetime, carrying out the method described above in the case of a charge transport by holes is comparatively difficult to realize from a technical standpoint. The spin states of electrons have a significantly longer lifetime, for which reason the method is preferably carried out using electrons as charge carriers.

Moreover, an application for determining a spin orientation (e.g. in a quantum dot) by projecting the spin onto the quantization direction of the semiconductor is also possible. The quantum dot represents the second contact in this case. The latter is situated at a distance from the first contact, which is smaller than the spin flip length. The semi-magnetic contact, whose spin orientation is defined by an external magnetic field, for example, by a magnet, determines the spin orientation of the nonmagnetic semiconductor onto which the spin of the quantum dot is projected. This application is of interest particularly in connection with quantum computing.

Other features which are considered as characteristic for the invention are set forth in the appended claims.

Although the invention is illustrated and described herein as embodied in a semiconductor element having a semi-magnetic contact, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
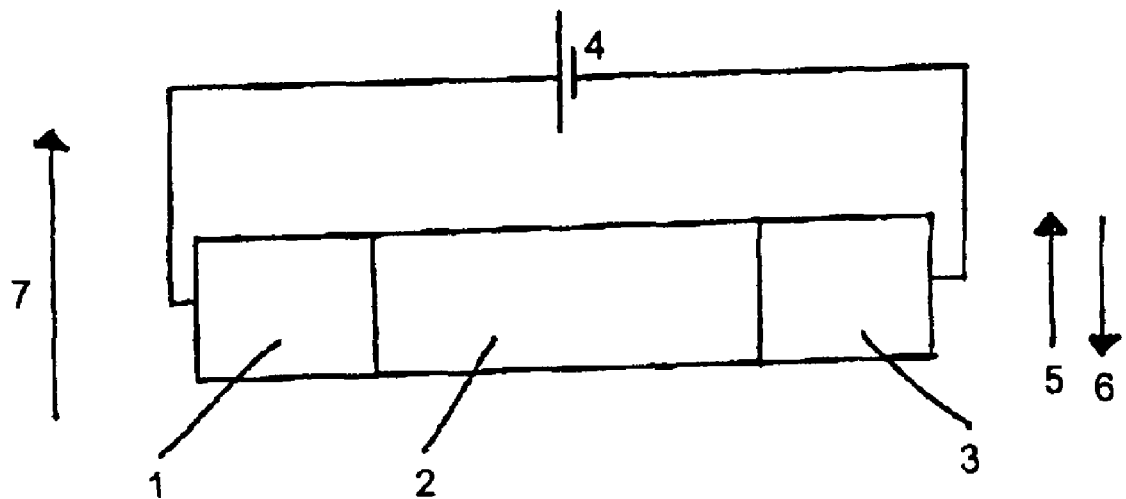
FIG. 1 is a diagram showing a side view of a linear configuration of a semiconductor element.

Referring now to the figures of the drawing in detail and first, particularly, to FIG. 1 thereof, there is shown a linear configuration of the semiconductor element according to the invention, in which the individual layers are arranged one beside the other in a sandwich-like manner. Via a first contact 1, electrons are injected into a nonmagnetic semiconductor 2, passed through the latter and are extracted again at the second contact 3. A potential 4 is present between first contact 1 and second contact 2. In the nonmagnetic semiconductor 2, the electrons are transported with two different spin directions, namely spin up (5, parallel) and spin down (6, antiparallel). That is to say the charge is transported in two spin channels. Without an external magnetic field, the electrons are transported in equal parts in the two spin channels 5, 6. If an external field 7 acts on the semiconductor element, splitting of the Zeeman terms of the electrons is effected in the first contact 1 and the electrons preferably occupy the energetically more favorable state (5, parallel), while the occupation of the energetically less favourable state (6, antiparallel) decreases. The electrons crossing into the nonmagnetic semiconductor 2 are therefore spin-polarized. The latter diffuse through the nonmagnetic semiconductor 2, and in the process they maintain their polarization within the spin flip length. Therefore, only one spin channel is used for the charge transport, for which reason the resistance of the element increases.

Figure 2:
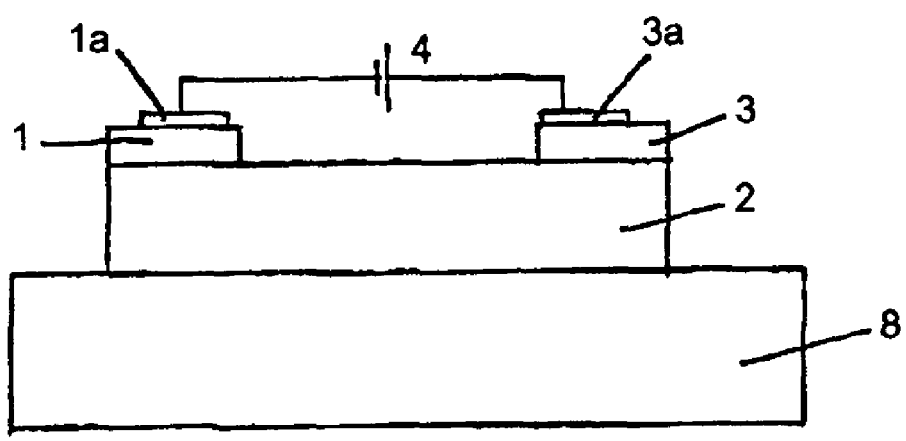
FIG. 2 is a diagram showing a side view of a configuration with a horizontal current direction between the contacts.

In order to be able to observe a change in the resistance of the semiconductor element in the magnetic field, it is not necessary for the first contact 1, the nonmagnetic semiconductor 2 and the second contact 3 to be arranged linearly one beside the other in a sandwich-like manner. A suitable configuration for the practical implementation of the semiconductor element is shown in FIG. 2. In this case, the first contact 1 and the second contact 3 are arranged on the layer of the nonmagnetic semiconductor 2. The potential 4 is again present between first contact 1 and second contact 3. The nonmagnetic semiconductor 2 is arranged on an insulating substrate 8. This configuration was also chosen for carrying out the experiments described below. For the electrical connection of the contacts 1, 3, contact pads 1a, 3a made of metal or a metal-like material are respectively arranged on the contacts 1, 3.

For the experiments described below, the configuration from FIG. 2 was produced in such a way that a layer of an n-doped ($10^{19}$ cm$^{-3}$) $Zn_{0.97}Be_{0.03}Se$ semiconductor 3, having a thickness of 500 nm, was deposited as the nonmagnetic semiconductor layer 2 on an insulating GaAs substrate 8. The n-type doping was carried out with iodine in this case. The layer of the nonmagnetic semiconductor 2 was deposited by molecular beam epitaxy. In order to fabricate the contacts 1, 3, a semi-magnetic layer made of $Zn_{0.89}Be_{0.05}Mn_{0.06}Fe$ (n=$5\times10^{18}$ cm$^{-3}$) was deposited on the layer of the nonmagnetic semiconductor 2. The conductivity of the layer was set by doping with iodine.

An aluminum layer was deposited to a thickness of 100 nm on the semi-magnetic layer and contact pads (200 $\mu$m$\times$250 $\mu$m) were defined lithographically on the aluminum layer in order to produce a contact to the semi-magnetic contacts 1, 3. These lithographically defined contact pads were then used as an etching mask for a wet-chemical etching process, during which the semi-magnetic semiconductor and about 10 nm of the thickness of the nonmagnetic semiconductor 2 were removed in the unmasked region. In a second optical lithographic step, an elevated region (mesa) was defined, which encompassed the two semi-magnetic contacts 1, 3 and also the layer of the semiconductor 2 arranged between the contacts 1, 3. The unmasked $Zn_{0.97}Be_{0.03}Se$ surrounding this region was subsequently removed by wet-chemical etching, with the result that the configuration shown in FIG. 2 was obtained.

Semiconductor elements with different layer thicknesses of the contacts 1, 3 and with different spacings of the contacts 1, 3 were fabricated according to the method described above.

The magnetic resistance change of the various semiconductor elements was measured at 4.2 K for magnetic field strengths of 0 to 7 T with a DC voltage of 100 $\mu$V. In this case, the data were measured only in the linear region of the change in the resistance. All $Zn_{0.89}Be_{0.05}Mn_{0.06}Se/Zn_{0.97}Be_{0.03}Se$ hybrid structures exhibited a strong positive magnetic resistance change.

Figure 3:
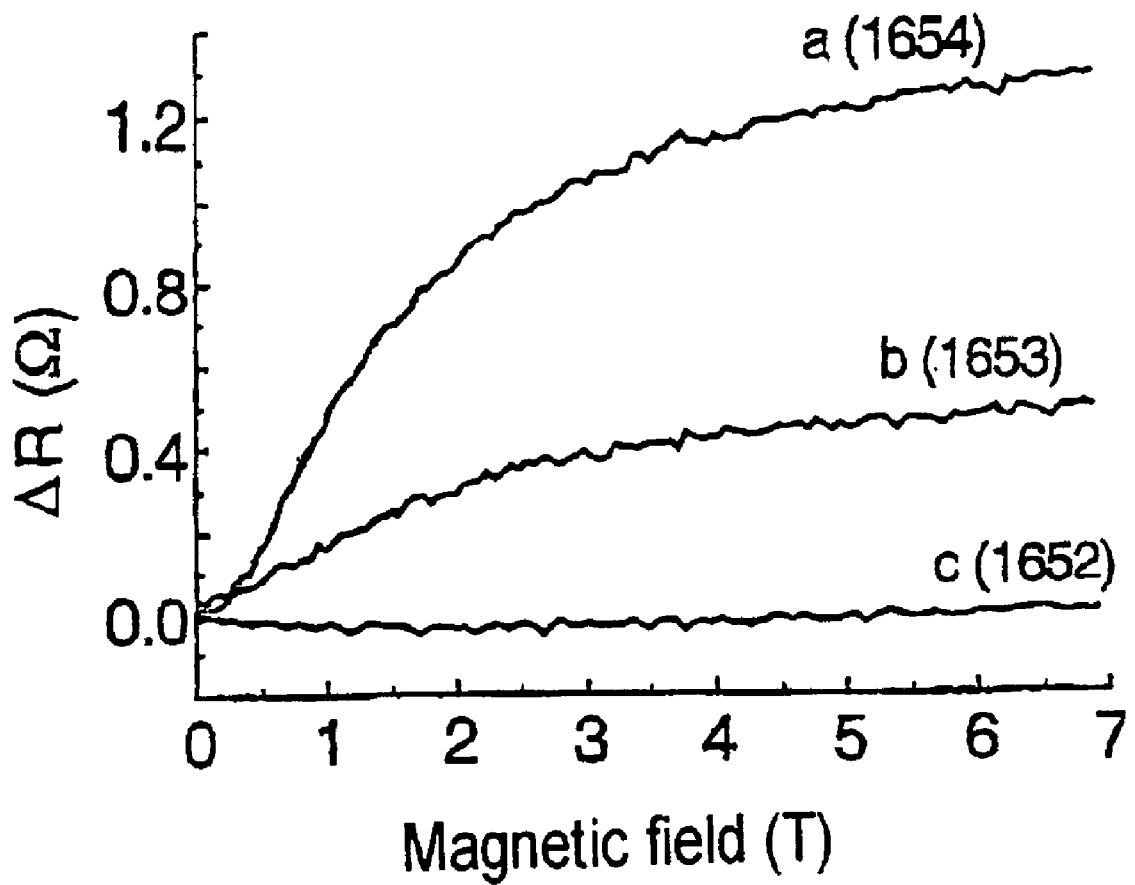
FIG. 3 is a diagram in which the change in resistance of a semiconductor element is plotted as a function of the magnetic field strength.

Exemplary curves of the magnetic resistance change are illustrated in FIG. 3 (curves (a) and (b)). The greatest observed change in the magnetic resistance was approximately 1.4 $\Omega$, given a total resistance of the configuration of 20.5 $\Omega$. If the contact resistance of 2 $\Omega$ is subtracted, a lower limit of $\Delta R/R=8\%$ can be estimated for the relative change in the resistance. The resistance reaches a saturation limit at fields of between 1 and 2 tesla. The observed change in the resistance is independent of the orientation of the semiconductor element in the magnetic field. If the layer thickness of the first and second contacts 1, 3 is reduced from 200 nm (FIG. 3, curve (a)) to 100 nm (FIG. 3, curve (b)), the resistance change decreases by the factor 3. A semiconductor element in which the contacts included a nonmagnetic semiconductor for comparison exhibits no change in the resistance in the magnetic field within a measurement accuracy of 0.2% (FIG. 3, curve (c)).

Figure 4:
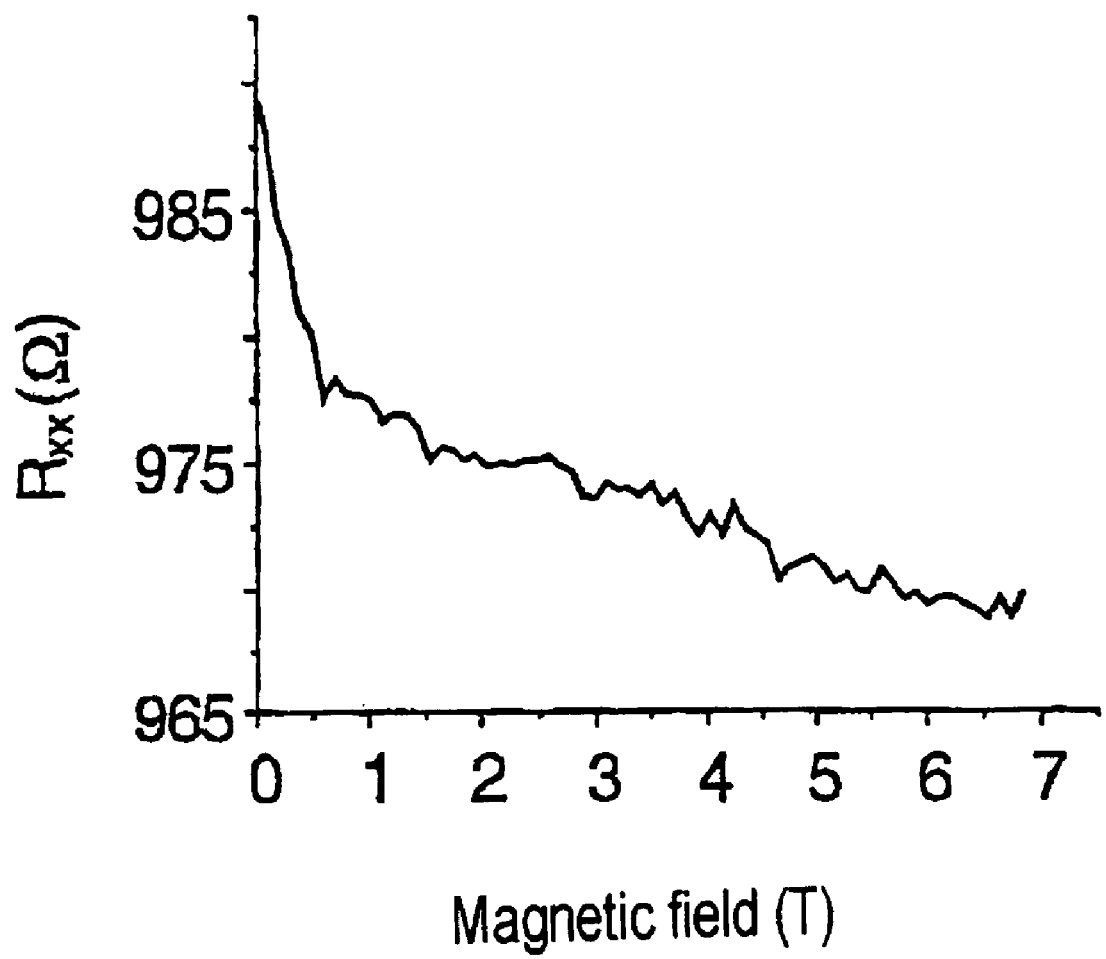
FIG. 4 is a diagram in which the change in resistance is shown as a function of the magnetic field strength for an individual layer of a highly n-doped $Zn_{0.89}Be_{0.05}Mn_{0.06}Se$.

The layers of the configuration from FIG. 2 have a high n-type doping in order to ensure that the intrinsic magnetic resistance change of the contacts 1, 3 is negative. With low doping (but above the transition to the insulator), the semi-magnetic contacts 1, 3 have an additional positive magnetic resistance change because of the e-e correction of the conductivity. This influence decreases with increasing doping n in accordance with $(k_F l)^{-3/2}$, where $k_F$ is the waved vector of the fermi energy and l is the mean free path length of the electron. The small negative magnetic resistance change (2%) of a sample which is constructed only from the semi-magnetic material is illustrated in FIG. 4.

Furthermore, the extent of the resistance change was determined as a function of the distance between the contacts 1, 3 given a layer thickness of the contacts of 100 nm. The experiments show that, with increasing distance, the absolute value of the positive magnetic resistance change decreases from 0.48 $\Omega$ (10 $\mu$m) through 0.4 $\Omega$ (20 $\mu$m) to 0.35 $\Omega$ (30 $\mu$m).

The configuration of the individual layers of the magnetoresistive semiconductor element can be modified within wide limits.

Figure 5:
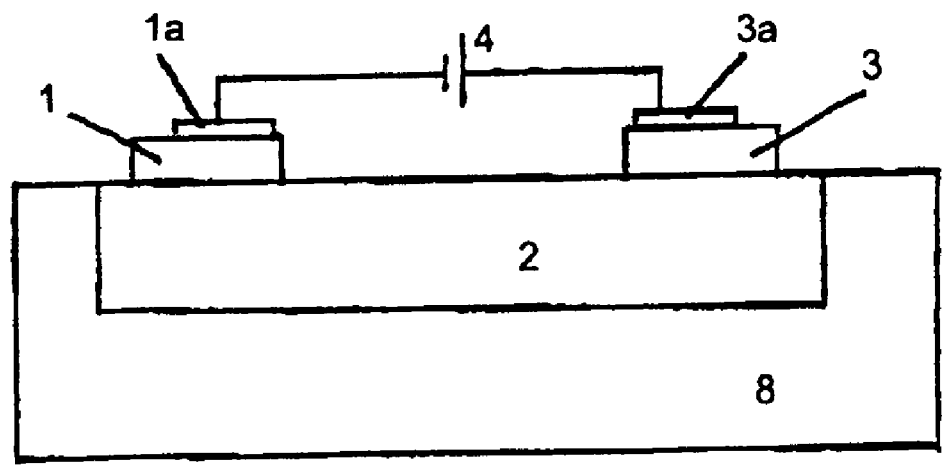
FIG. 5 is a diagram showing a side view of a configuration with a horizontal current direction between the contacts.

A further suitable structure is shown in FIG. 5. In this case, however, the nonmagnetic semiconductor 2 is implanted into a semiconductor substrate 8. The conductive region of the nonmagnetic semiconductor 2 can be defined by ion implantation. This method is known from planar silicon technology. The conductivity can be set by the degree of doping. In the case of n-type doping of the nonmagnetic semiconductor 2, the semiconductor substrate 8 can be p-doped. As a result, it is possible to achieve decoupling with respect to adjacent elements, since one of the p-n junctions always blocks in that case. Since first contact 1 and second contact 3 can be applied simultaneously to the layer of the nonmagnetic semiconductor 2, only one epitaxy step is required for fabricating the two contacts 1, 3. The electrical connection of the contacts 1, 3 is again effected in each case using contact pads 1a, 3a which are composed of a metal or a metal-like material.

Figure 6:
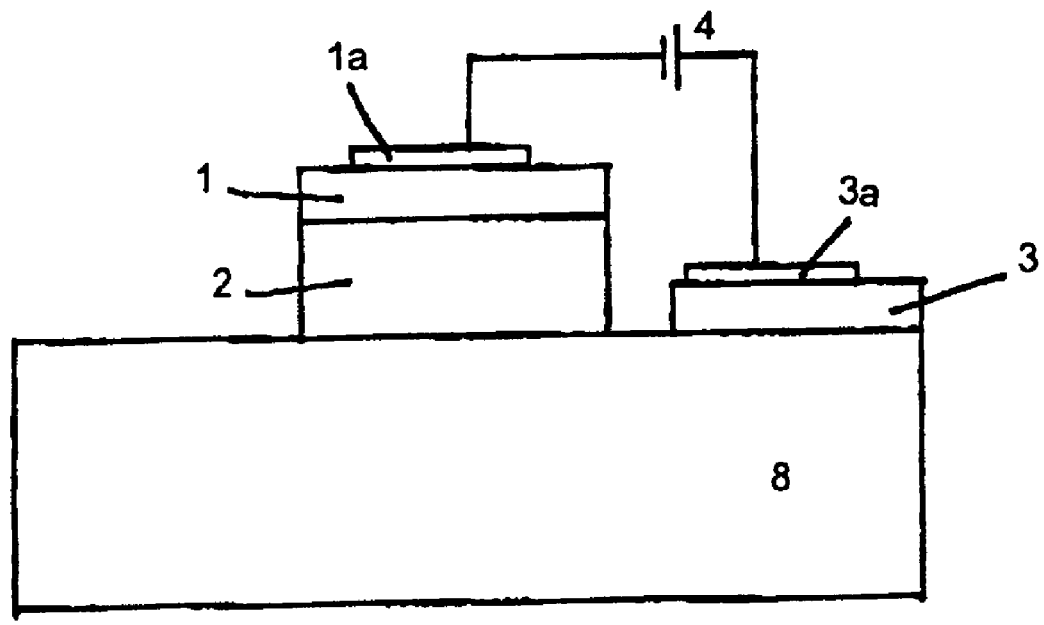
FIG. 6 is a diagram showing a side view of a configuration with a mixed current direction between the contacts.

A further embodiment is shown in FIG. 6. In this case, the nonmagnetic semiconductor 2 is arranged on a semiconductor substrate 8 and the semi-magnetic first contact 1 is formed as a layer on the nonmagnetic semiconductor 2. The second contact 3, which may likewise include a semi-magnetic semiconductor or else a nonmagnetic material, is likewise arranged directly on the semiconductor substrate 8. The semiconductor substrate 8 can also act directly as a second contact in the sense of the invention. The electrical connection of the contacts 1, 3 is again effected in each case using contact pads 1a, 3a which are composed of a metal or a metal-like material. The charge transport is in this case effected through the semiconductor substrate 8. The semiconductor elements shown are fabricated according to known methods. The following are suitable, for example: molecular beam epitaxy, low-pressure vapor phase epitaxy, atmospheric pressure vapor phase epitaxy or else UHV vapor phase epitaxy.

Figure 7:
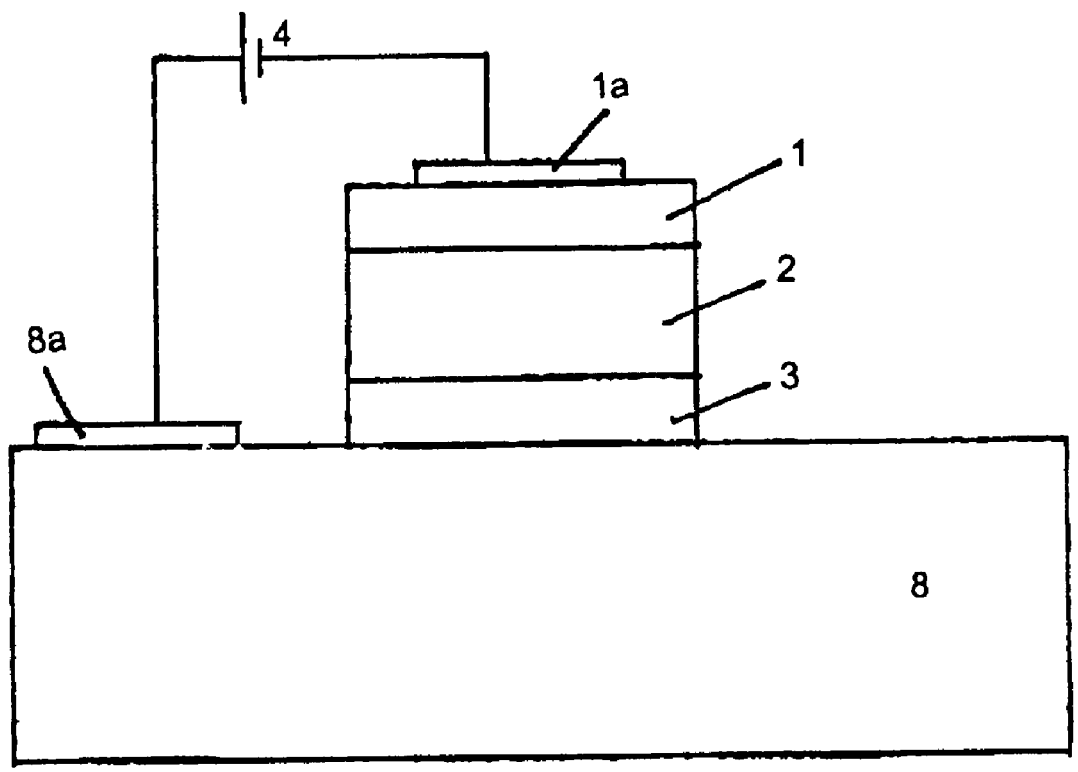
FIG. 7 is a diagram showing a side view of a configuration with a mixed current direction between the contacts.

A further embodiment, having only a very small space requirement, is shown in FIG. 7. In this case, a second contact 3, which may include a semi-magnetic material or a nonmagnetic material, is arranged on the semiconductor substrate 8. The semiconductor substrate 8 can also form the second contact 3 directly. Arranged on the second contact 3 is a layer made of a nonmagnetic semiconductor 2, on which is arranged a further layer made of a semi-magnetic semiconductor which forms the first contact 1. In this case, the charge transport is partly effected via the semiconductor substrate 8. The electrical contact connection is effected via the contact pad 1a at the first contact 1 and by the contact pad 8a at the semiconductor substrate 8. The contact pads 1a, 8a are composed of a metal or a metal-like material.

Figure 8A:
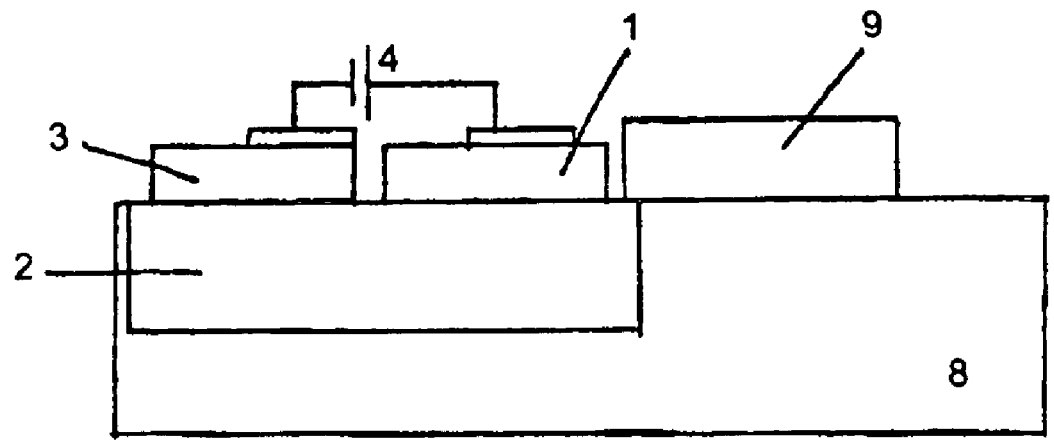
FIG. 8A is a side view of a memory element.
Figure 8B:
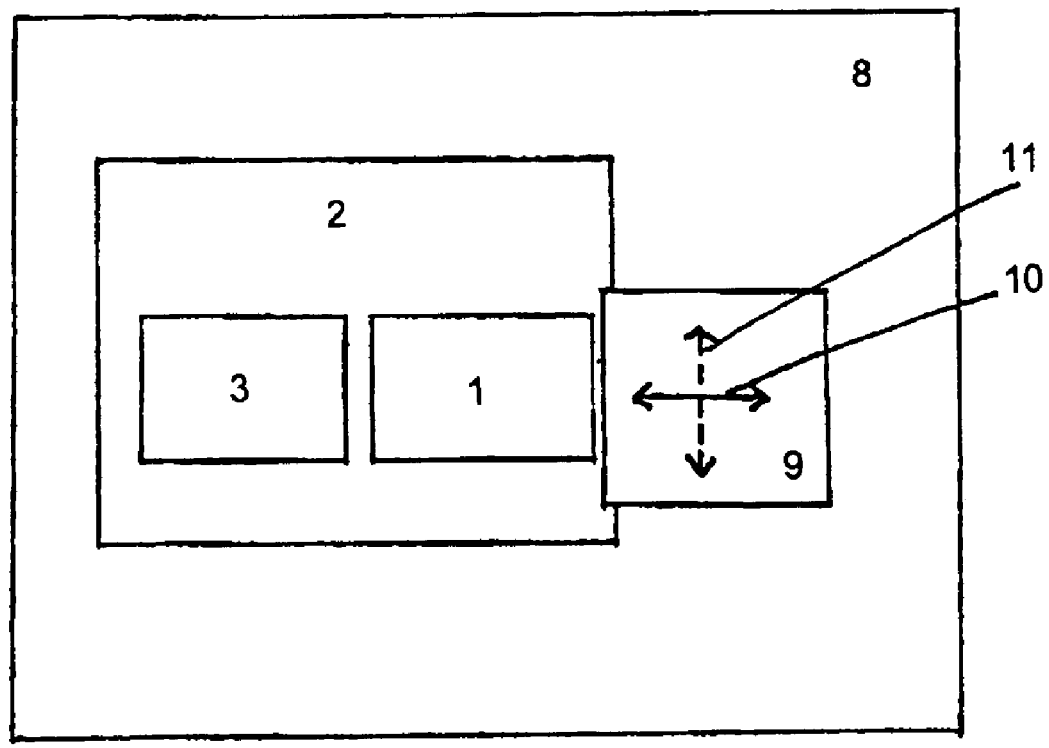
FIG. 8B is plan view of the memory element shown in FIG. 8A.

FIGS. 8A and 8B show a side view and a plan view, respectively, of a configuration of the kind that can be used for a memory element. An n-doped region, which forms the nonmagnetic semiconductor 2 of the semiconductor element, is implanted in a substrate 8, for example, a p-doped silicon substrate. On the nonmagnetic semiconductor 2, there are arranged one beside the other, a first semi-magnetic contact 1, which may be constructed from $Zn_{0.89}Be_{0.05}Mn_{0.06}Se$, for example, and also a second contact 3, which may be constructed from a nonmagnetic material, for example aluminum, or likewise from a semi-magnetic material, for example $Zn_{0.89}Be_{0.05}Mn_{0.06}Se$. A ferromagnetic element 9, which may be composed of cobalt, for example, is arranged adjacent to the first semi-magnetic contact 1. The magnetization direction of the ferromagnetic element 9 can be altered. In this case, first contact 1 and ferromagnetic element 9 are arranged so close together that the first contact 1 lies in the leakage field of the ferromagnetic element 9. The distance between the semi-magnetic first contact 1 and the ferromagnetic element 9 is suitably chosen in the range of 50–100 nm.

The function of the memory element is explained with reference to FIG. 8B. In the state with a high resistance, the first contact 1 lies in the leakage field of the magnetization 10 of the ferromagnetic element 9. In this state, spin-polarized electrons are injected from the first contact 1 into the nonmagnetic semiconductor 2, so that only one of the spin channels can be utilized for the charge transport. The device therefore exhibits an increased resistance. If the magnetization 10 of the ferromagnetic element 9 is rotated through 90° (magnetization 11), the first contact 1 no longer lies in the leakage field of the ferromagnetic element 9. The electrons injected from the first contact 1 into the nonmagnetic semiconductor 2 are therefore no longer spin-polarized, for which reason both spin channels in the nonmagnetic semiconductor 2 can be utilized for the charge transport. As a result, the resistance of the semiconductor element decreases.

Figure 9:
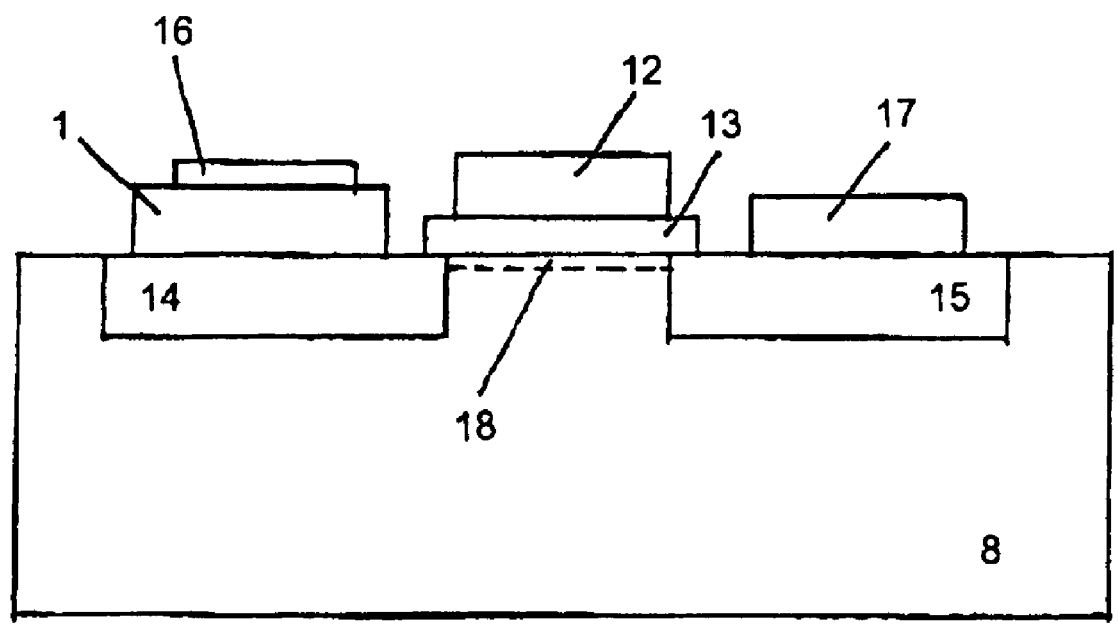
FIG. 9 is a cross-sectional view through a field-effect transistor that includes an inventive semiconductor element.

FIG. 9 shows a possible configuration for a field-effect transistor. A first n-doped region 14, which acts as source, and a second n-doped region 15, which acts as drain, are defined in a p-doped silicon substrate 8. A gate electrode 12 is arranged in the region between the source and the drain. The gate electrode 12 is insulated from the substrate 8 by a gate dielectric 13. A first contact 1 made of a semi-magnetic material is arranged on the n-doped region 14 acting as the source. The contact may be constructed from $Zn_{0.89}Be_{0.05}Mn_{0.06}Se$, for example. A metal layer 16 is arranged as a contact pad on the first contact. This metal layer 16 may be composed of aluminum, for example. Using this metal layer 16, electrons are fed to the first contact 1. A metal layer 17 is likewise arranged on the n-doped region 15 acting as a drain this metal layer 17 may, for example, likewise be composed of aluminum. The semiconductor element in the sense of the invention is first formed by the first semi-magnetic contact 1 and the n-doped region 14 which acts as a nonmagnetic semiconductor. In the field-free state, that is to say if no voltage is present at the gate electrode, no current flows from source to drain. Therefore, an alteration of the resistance in the nonmagnetic semiconductor, i.e. in the n-doped region 14, through the action of an external magnetic field cannot occur either. If a voltage is applied at the gate electrode 12, electrons accumulate in the field of the gate 12 and a conduction channel 18 arises in the p-doped substrate 8, in which the charge transport is effected by electrons. The conduction channel 18 then forms the second contact in the sense of the invention, by way of which contact, the charge carriers are extracted from the nonmagnetic semiconductor, or the charge carrier transport between the contact pads 16 and 17 is effected only by electrons.

In the embodiment shown in FIG. 9, the semiconductor element according to the invention is formed at the source 14. However, it is also possible to form the semiconductor element according to the invention at the drain 15. Equally, it is possible to form a semiconductor element both at the source and at the drain. Equally, the configuration of the FET is not restricted to the embodiment shown in FIG. 9.

Figure 10:
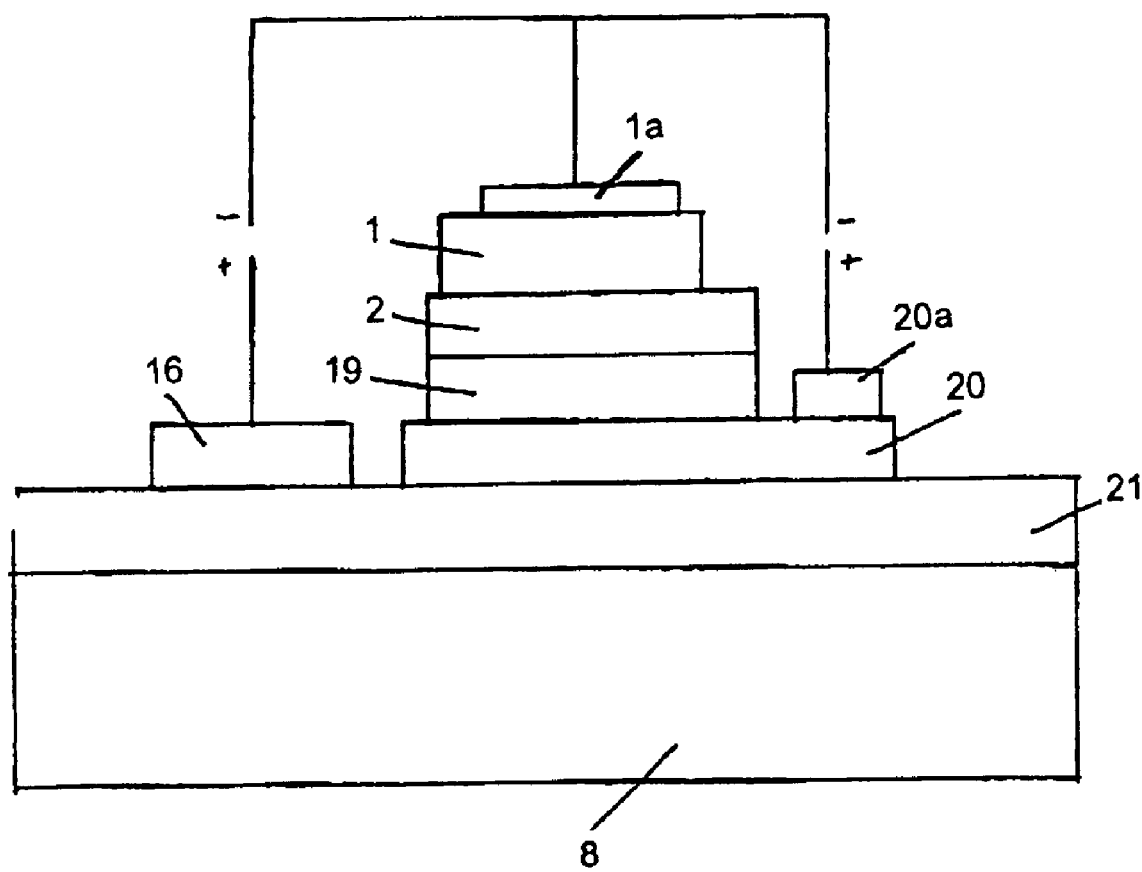
FIG. 10 is a cross-sectional view through a bipolar transistor that includes an inventive semiconductor element.

FIG. 10 shows the inventive semiconductor element as a constituent part of a bipolar transistor. An npn transistor is shown. The transistor includes a first contact 1 made of a semi-magnetic material, for example ZnBeMnSe. The first contact 1 is adjoined by a layer of a nonmagnetic semiconductor 2. This layer is arranged on an n-doped region which acts as emitter 19 of the transistor. Situated beneath the emitter 19 is a thin p-doped base 20 of the transistor, which is adjoined by the n-doped collector 21. The ohmic contact to the semi-magnetic first contact 1, base 20 and collector 21 is in each case produced by the metallic contact pad 16 and the metallic contact pads 1a and 20a. If a positive voltage relative to the emitter 19 is present at the base 20, then a current flows through the semiconductor element, which current, in the region of the base 20, is carried by electrons which diffuse from the emitter 19 to the collector 21.

However, it is also possible for the emitter 19 to directly form the nonmagnetic semiconductor of the semiconductor element. The spin-polarized electrons injected from the semi-magnetic contact into the emitter then diffuse through the base 20 into the collector 21, provided that electrons also flow from the emitter 19 to the contact of the base 20. The base current itself is not utilized for the measurement of a resistance.

The semiconductor element can also subsequently be arranged at the collector or concomitantly include the collector.

Figure 11:
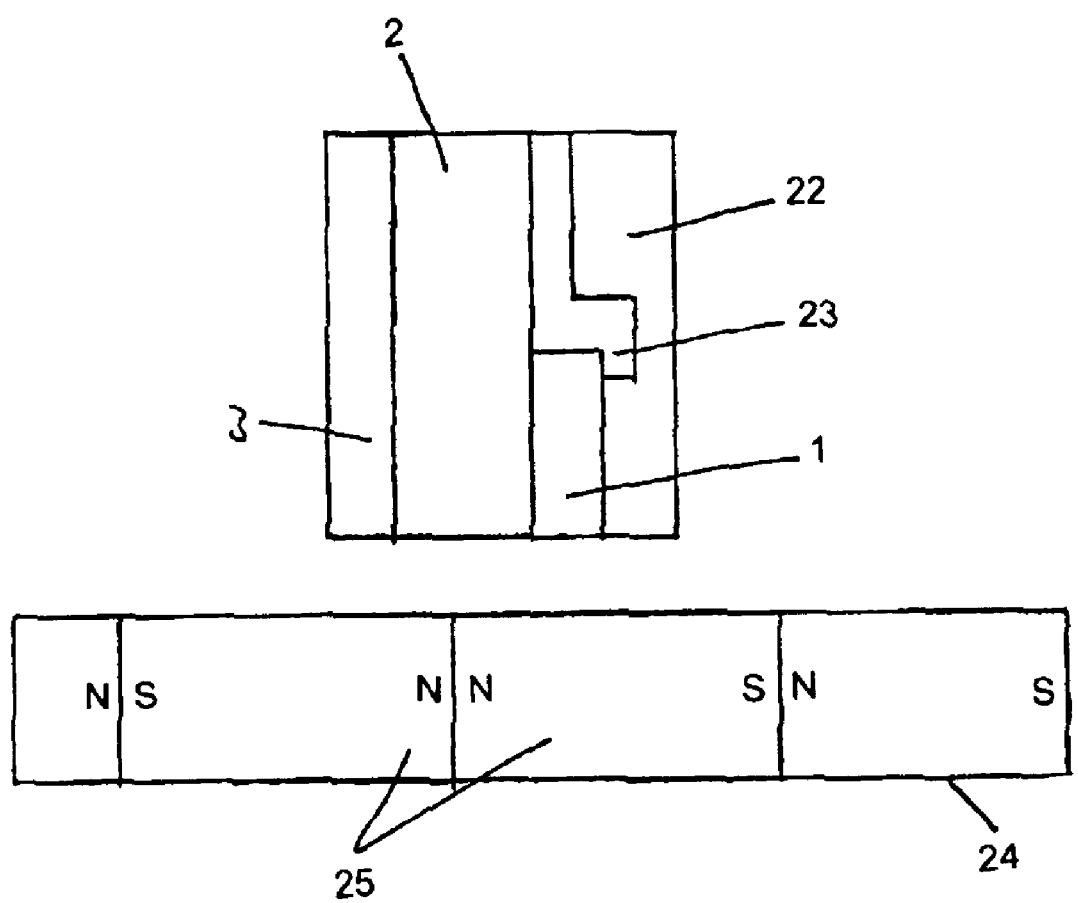
FIG. 11 is a longitudinal cross-sectional view through a read head that includes an inventive semiconductor element.

FIG. 11 diagrammatically shows the construction of a read head including the inventive semiconductor element. Via a metal layer 22, which may be composed of aluminum, for example, the electrons are fed to a first contact 1, constructed from a semi-magnetic material, for example $Zn_{0.89}Be_{0.05}Mn_{0.06}Se$. The first contact 1 is adjoined by a layer of the nonmagnetic semiconductor 2. The layer may be constructed from n-doped silicon, for example. An insulating layer 23, for example made of $SiO_2$ is provided between the metal layer 22 and the layer of the nonmagnetic semiconductor 2. The layer of the nonmetallic semiconductor 2 is adjoined by a layer which acts as second contact 3 and may be composed of aluminum, for example. A magnetic storage medium 24 including differently polarized cells 25 is arranged at a short distance from the read head. The magnetic storage medium may be a hard disk, for example. The first contact 1 constructed from the semi-magnetic material is encompassed by the magnetic field of the cells 25, so that a spin polarization of the electrons entering into the nonmagnetic semiconductor 2 through the first contact can be brought about. In order to read out the data stored in the magnetic storage medium 24, the latter is moved past the read head. The external magnetic field that acts on the semi-magnetic material of the first contact changes as a result of the polarization of the individual cells 25. As a consequence, there is a change in the degree of spin polarization of the electrons injected into the layer of the nonmagnetic semiconductor 2 and thus also in the resistance of the semiconductor element. As a result, there is a change in the intensity of the current flowing through the layer of the nonmagnetic semiconductor 2. This change can be measured by a measuring device (not illustrated) which is connected to the first device via the metal layer 22 and to the read head via the layer 3 acting as a second contact, as a result of which the information stored in the storage medium 24 can be read out.

Figure 12:
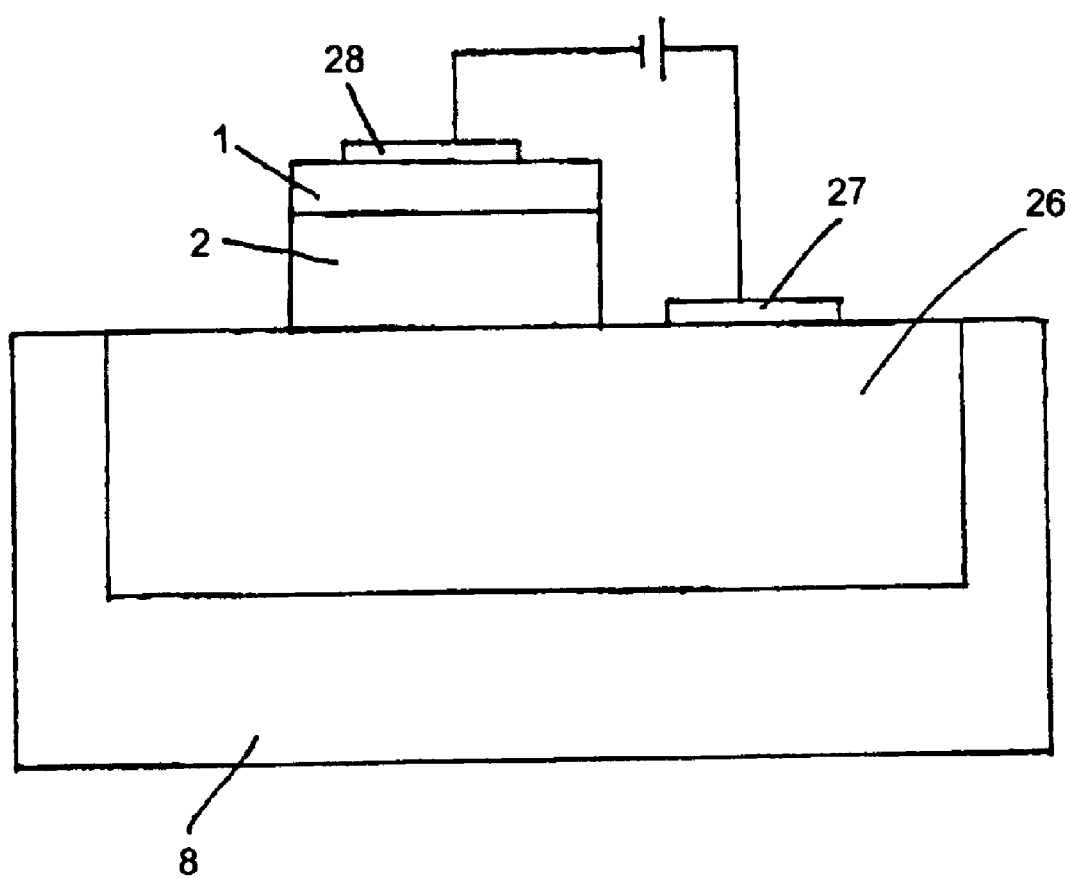
FIG. 12 is a diagram showing a semiconductor element that is decoupled from adjacent semiconductor elements by a Schottky diode.

FIG. 12 shows a configuration with which a plurality of semiconductor elements arranged on a substrate, can be decoupled from one another. An n-doped semiconductor region 26 is implanted in a p-doped substrate 8, generally a silicon substrate. Arranged on the n-doped region 26 is a nonmagnetic semiconductor 2, on which, in turn, is applied a layer of a semi-magnetic material, which layer acts as first contact 1. The semi-magnetic contact 1 is contact-connected via a metal contact 28 with a linear current-voltage characteristic curve (ohmic contact). Furthermore, arranged on the n-doped region 26 is a metal contact 27 that is chosen in such a way that a Schottky diode is produced at the interface. As a result of this, a current flow for measuring the resistance is possible only in one direction, so that it is possible to contact-connect a plurality of semiconductor elements in a matrix known from semiconductor memories with row and column lines. A semiconductor element can in each case be addressed separately by driving via a row and a column line.

FIG. 12 shows only one of the possible embodiments. Thus, by way of example, the n-doped region 26 can also form the nonmagnetic semiconductor 2 directly. The semi-magnetic contact 1 is then arranged directly on the implanted region 26. Furthermore, it is also possible to interchange the ohmic contact 28 and Schottky contact 27, whereby the direction of the possible current flow changes. Schottky diodes exhibit a comparatively small voltage drop in the forward direction. A magnetoresistive effect can therefore also be observed in combination with the semi-conductor element. The configuration is suitable in particular in conjunction with memory elements as have been described above with reference to FIG. 8, for example. In the case where the semiconductor element is used as a sensor, a diode is preferably not used, because of the loss of sensitivity brought about by the diode.

Figure 13:
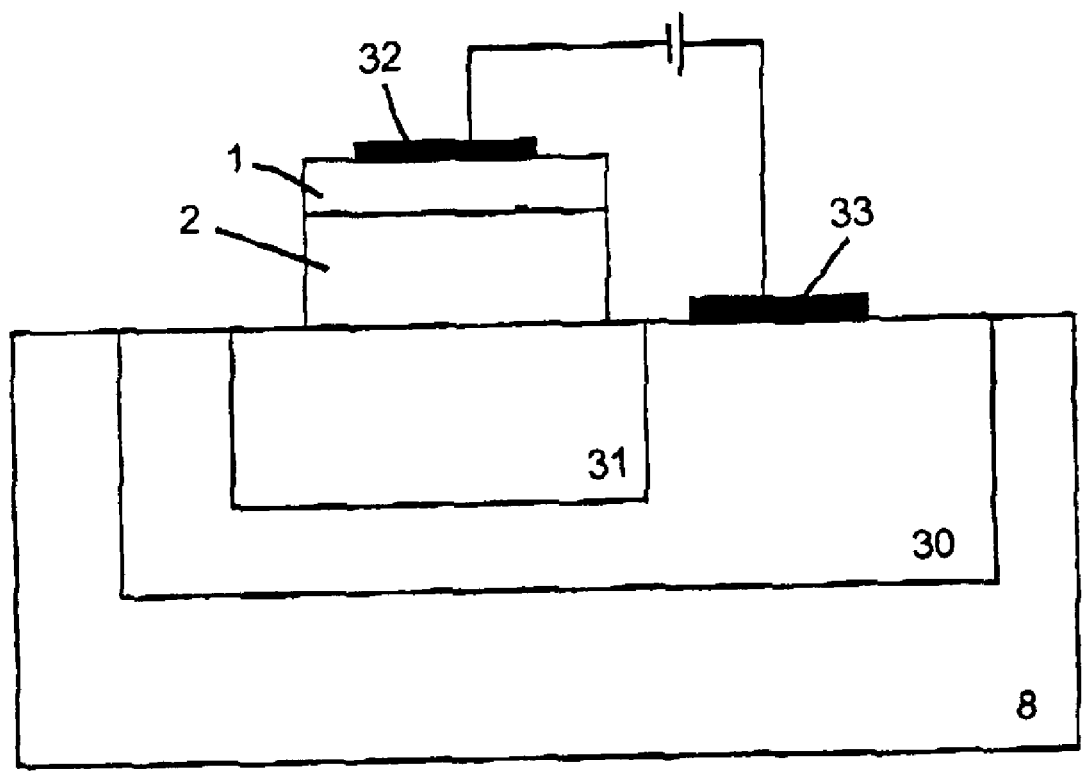
FIG. 13 is a diagram showing a semiconductor element that is decoupled from adjacent semiconductor elements by a pn diode.

FIG. 13 shows a decoupling of the semiconductor element via a pn diode. Such a configuration is suitable for applications in which the requirements made of the sensitivity of the measurement of the resistance are not too stringent, for example in MRAMs. This is expedient in particular for integrated silicon diodes, since a high degree of integration of the electronic components is possible in this way. In principle, however, other semiconductor materials are also possible for the fabrication of the diode. FIG. 13 shows a semiconductor substrate 8, for example, an n-doped silicon substrate. A p-doped region 30 is integrated in a well-like manner into the semiconductor substrate 8, which region in turn encloses an n-doped region 31. The regions 30 and 31 can be doped for example by ion implantation into the silicon substrate. Arranged on the n-doped region 31 is a nonmagnetic semiconductor 2, into which spin-polarized electrons are injected from the semi-magnetic first contact 1 under the influence of a magnetic field. The electrical contact to the semi-magnetic first contact and to the p-doped region 30 is in each case produced via metallic contact pads 32 and 33. The electrons first pass from the metallic contact pad 32 into the semi-magnetic contact 1, where they experience spin polarization under the influence of an external magnetic field. The spin-polarized electrons are subsequently injected into the nonmagnetic semiconductor 2 and then pass into the n-doped region 31. A recombination with holes, by which the charge transport is effected in the p-doped region 30, is effected at the boundary with the p-doped region. Finally, extraction of electrons is effected at the contact pad 33 in order to complete the electric circuit. A charge transport in the opposite direction is not possible since the diode formed by the regions 30 and 31 is then reverse-biased. The diode formed by the p-doped region 30 and n-doped silicon substrate 8 effects insulation of the individual components relative to one another, so that, for example in a matrix, the components of one column are insulated from the components of the adjacent column.

Figure 14:
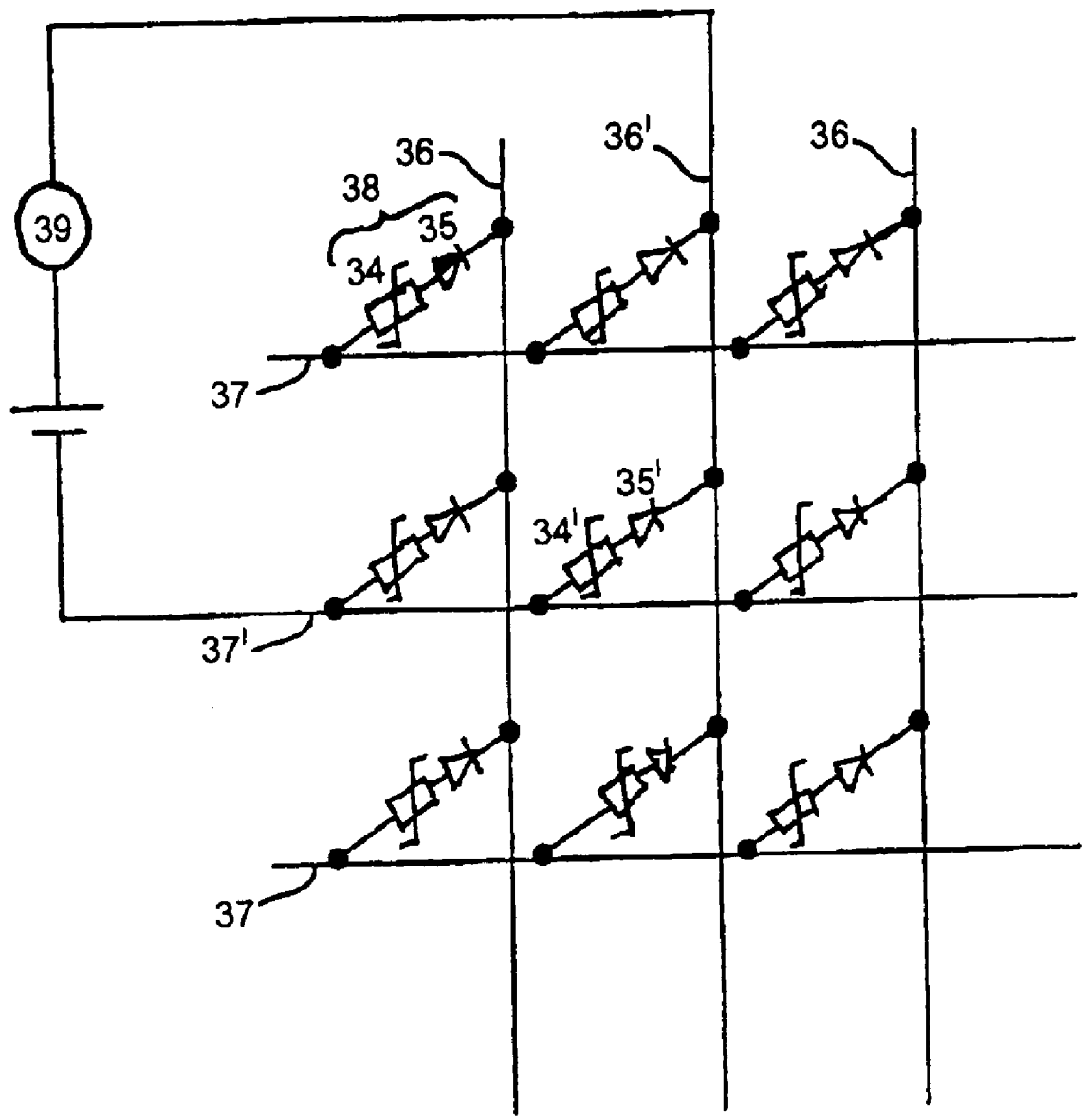
FIG. 14 is a diagram of a matrix configuration in which the magnetoresistive semiconductor elements are decoupled by diodes.

FIG. 14 shows the configuration of electronic components in a matrix. The electronic components each include the magnetoresistive semiconductor element 34 and a diode 35 for decoupling the adjacent magnetoresistive semiconductor elements. The matrix is formed by column lines 36 and row lines 37. Each electronic component 38 formed from a magnetoresistive semiconductor element 34 and a diode 35 that are connected between a column line 36 and a row line 37.

When applied to the configuration illustrated in FIG. 12, the metal contact 28 is connected to the row line 37 and the metal contact 27 to the column line 36. In the case of the configuration illustrated in FIG. 13, the contact pad 32 is connected to the row line 37 and the contact pad 33 to the column line 36.

If the intention is to determine the resistance of the magnetoresistive semiconductor element 34', a measurement voltage is applied to the row line 37' and the column line 36' in order that the measuring configuration 39 can determine the resistance. In this case, of all the possible current paths, only the diode 35' is forward-biased, while all other possible current paths always contain at least one diode 35 in the reverse direction. It is thus possible to selectively determine the resistance or the resistance change in the magnetoresistive semiconductor element 34'.

Figure 15:
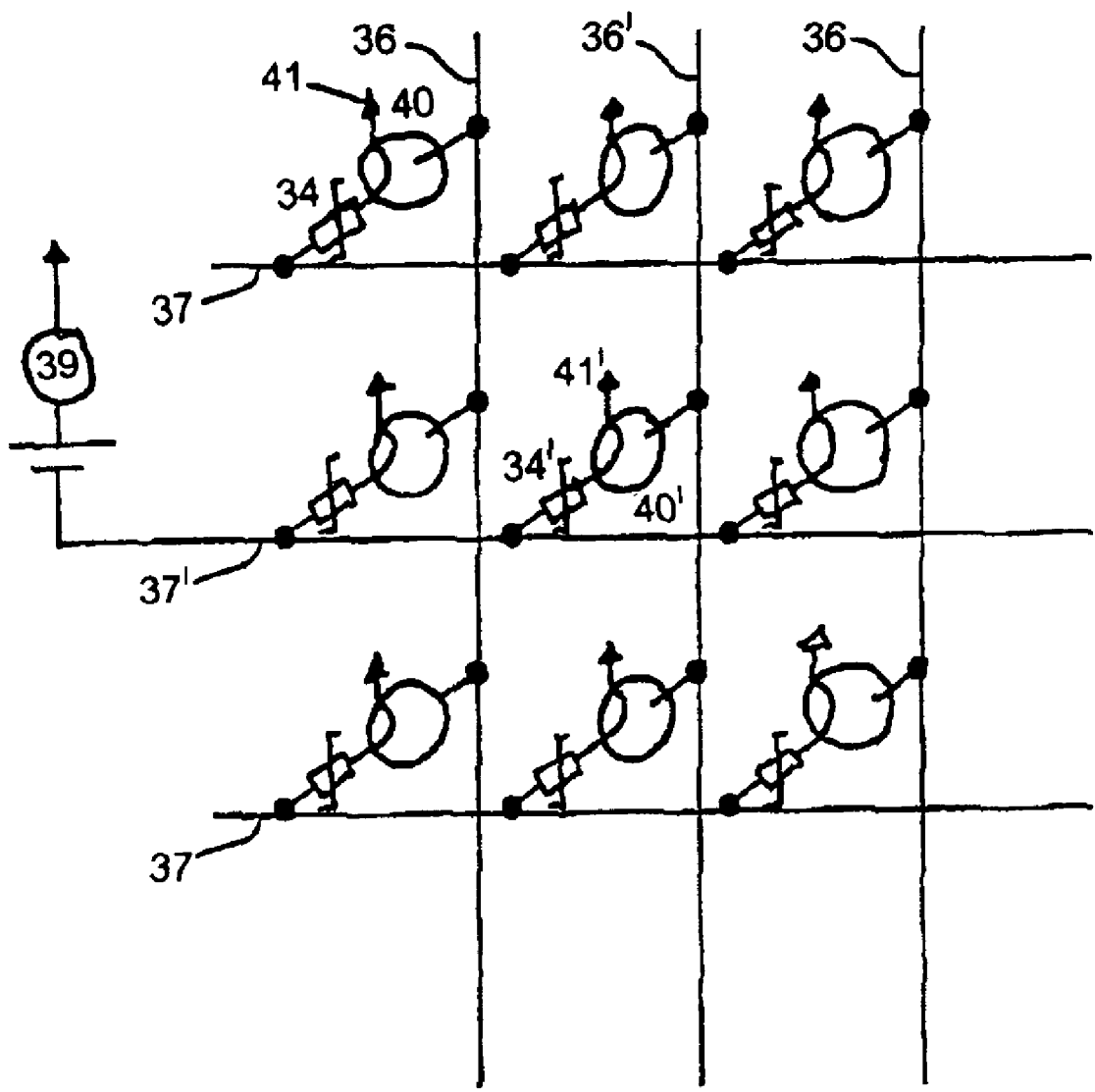
FIG. 15 is a diagram of a matrix configuration in which the magnetoresistive semiconductor elements are decoupled by transistors.

FIG. 15 shows a matrix configuration in which the magnetoresistive semiconductor elements 34 are decoupled by a transistor 40. Such a matrix can be realized with the configurations shown in FIGS. 9 and 10.

The matrix again includes column lines 36 and row lines 37. Via the row lines 37, a measurement voltage can in each case be applied to a magnetoresistive semiconductor element. The contact 41 is at the same potential in each case for all the transistors 40. The transistors 40 can in each case be driven that is to say switched between on state and off state, via the column lines 36.

If the electronic component formed from the magnetoresistive semiconductor element 34 and the transistor 40 is formed by the configuration illustrated in FIG. 9, the contact pad 16 arranged on the semi-magnetic contact 1 is connected to the row line 37 and the gate electrode 12 to the column line 36. The contact (drain) formed by the metal layer 17 is at the same potential in all the field-effect transistors and corresponds to the contact 41 in FIG. 15.

In the case of the bipolar transistor illustrated in FIG. 10, the contact pad 1a is connected to the row line 37 and the contact pad 20a (base) is connected to the column line 36, while the contact 16 (collector 21) is at the same potential in all the electronic components.

In order to be able to determine the resistance of the magnetoresistive semiconductor element 34' in the matrix illustrated in FIG. 15, a measurement voltage is applied to row line 37' and contact 41', so that the measuring device 39 can determine the resistance of the magnetoresistive semiconductor element 34'. The transistor 41' is driven via column line 36, so that the transistors 41 connected to the column line 36' are turned on. Since a measurement voltage is present only in row line 37', a measurement circuit is generated only in the case of the associated transistor 40', so that selectively only the resistance of the magnetoresistive semiconductor element 34' is determined.

The change in the resistance in the inventive magneto-electrical semiconductor element is based on a new effect which is fundamentally different from the previously known magnetoresistive effects, such as GMR, AMR (anisotropic magnetoresistive) or TMR. The magnetoresistive semiconductor element can be integrated into a multiplicity of components and can be varied within wide limits in terms of its construction.

We claim:

1. A magnetoresistive semiconductor element, comprising:
    a first contact made of a semi-magnetic material;
    a second contact;
    a layer of a nonmagnetic semiconductor configured between said first contact and said second contact; and
    a tunnel barrier configured between said first contact and said layer of said nonmagnetic semiconductor.

2. The magnetoresistive semiconductor element according to claim 1, wherein said semi-magnetic material is a semiconductor.

3. The magnetoresistive semiconductor element according to claim 1, wherein said second contact is made of a nonmagnetic material.

4. The magnetoresistive semiconductor element according to claim 1, wherein said second contact is made of a semi-magnetic material.

5. The magnetoresistive semiconductor element according to claim 4, further comprising a tunnel barrier configured between said second contact and said layer of said nonmagnetic semiconductor.

6. The magnetoresistive semiconductor element according to claim 1, wherein said second contact is made of a ferromagnetic material.

7. The magnetoresistive semiconductor element according to claim 6, further comprising a tunnel barrier configured between said second contact and said layer of said nonmagnetic semiconductor.

8. The magnetoresistive semiconductor element according to claim 1, wherein said semi-magnetic material is a II–IV semiconductor.

9. The magnetoresistive semiconductor element according to claim 8, wherein said II–VI semiconductor is $Be_xMn_yZn_{1-x-y}Se$ with $0<x<1$, $0<y<1$ and $0.0001<y<0.2$.

10. The magnetoresistive semiconductor element according to claim 1, further comprising a Schottky diode for providing a current path for decoupling.

11. The magnetoresistive semiconductor element according to claim 1, further comprising a pn diode for providing a current path for decoupling.

12. A storage element, comprising:
    a magnetoresistive semiconductor element, containing:
    a first contact made of a semi-magnetic material;
    a second contact;
    a layer of a nonmagnetic semiconductor configured between said first contact and said second contact; and
    a tunnel barrier configured between said first contact and said layer of said nonmagnetic semiconductor; and
    a ferromagnetic element configured adjacent said first contact.

13. The storage element according to claim 12, further comprising a Schottky diode for decoupling.

14. A field effect transistor, comprising:
    a source electrode;
    a drain electrode;
    a gate electrode;
    at least one first contact of a semi-magnetic material for injecting spin-polarized charge carriers into said source electrode and/or for extracting spin-polarized charge carriers from said drain electrode;
    a tunnel barrier configured between said first contact and said source electrode; and
    a tunnel barrier configured between said first contact and said drain electrode.

15. A bipolar transistor, comprising:
    a section acting as an emitter;
    a section acting as a collector;
    a region configured between said emitter and said collector and acting as a base;
    at least one first contact for injecting spin-polarized charge carriers into said emitter and/or for extracting spin-polarized charge carriers from said collector;
    a tunnel barrier configured between said first contact and said emitter; and
    a tunnel barrier configured between said first contact and said collector.

16. A magnetic sensor, comprising: a magnetoresistive semiconductor element including: a first
    contact made of a semi-magnetic material, a second contact, a layer of a nonmagnetic semiconductor configured between said first contact and said second contact, and a tunnel barrier configured between said first contact and said layer of said nonmagnetic semiconductor;
    a plurality of electric feed and discharge lines, each one of said plurality of electric feed and discharge lines connected to a respective one of said first contact and said second contact; and
    a measuring device connected to said plurality of electric feed and discharge lines for measuring a change in electrical resistance.

17. A read head for reading information stored in magnetic storage media, comprising:
    a magnetoresistive semiconductor element including: a first contact made of a semi-magnetic material, a second contact, a layer of a nonmagnetic semiconductor configured between said first contact and said second contact, and a tunnel barrier configured between said first contact and said layer of said nonmagnetic semiconductor;
    a plurality of electric feed and discharge lines, each one of said plurality of electric feed and discharge lines connected to a respective one of said first contact and said second contact; and
    a measuring device connected to said plurality of electric feed and discharge lines for measuring a change in electrical resistance.

* * * * *